United States Patent
Iwata

(10) Patent No.: US 10,030,184 B2
(45) Date of Patent: *Jul. 24, 2018

(54) ADDITION ONE PART CURING TYPE HEAT-CONDUCTIVE SILICONE GREASE COMPOSITION

(71) Applicant: Shin-Etsu Chemical Co., Ltd., Tokyo (JP)

(72) Inventor: Mitsuhiro Iwata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 15/291,165

(22) Filed: Oct. 12, 2016

(65) Prior Publication Data

US 2017/0101570 A1  Apr. 13, 2017

(30) Foreign Application Priority Data

Oct. 13, 2015 (JP) .................................. 2015-201832

(51) Int. Cl.
| | |
|---|---|
| C09K 5/08 | (2006.01) |
| C08L 83/04 | (2006.01) |
| C08J 3/28 | (2006.01) |
| H01L 23/373 | (2006.01) |
| C08K 3/08 | (2006.01) |
| C08K 3/22 | (2006.01) |

(52) U.S. Cl.
CPC .................. *C09K 5/08* (2013.01); *C08J 3/28* (2013.01); *C08L 83/04* (2013.01); *H01L 23/3737* (2013.01); *C08K 2003/0812* (2013.01); *C08K 2003/2227* (2013.01); *C08L 2205/025* (2013.01); *C08L 2205/03* (2013.01)

(58) Field of Classification Search
CPC ............ C08J 3/28; C08L 83/04; C08G 77/06
See application file for complete search history.

(56) References Cited

U.S. PATENT DOCUMENTS

| | | | |
|---|---|---|---|
| 6,306,957 B1 | 10/2001 | Nakano et al. | |
| 6,649,258 B2 | 11/2003 | Yamada et al. | |
| 6,818,600 B2 | 11/2004 | Yamada et al. | |
| 7,329,706 B2 | 2/2008 | Fukui et al. | |
| 8,633,276 B2 | 1/2014 | Domae et al. | |
| 9,543,460 B2* | 1/2017 | Kretschmann | C08L 83/04 |
| 2004/0242762 A1 | 12/2004 | Horikoshi et al. | |
| 2012/0292558 A1* | 11/2012 | Kodama | C08G 77/20 252/75 |
| 2013/0072592 A1* | 3/2013 | Inafuku | B05D 3/067 522/172 |
| 2015/0148273 A1* | 5/2015 | Matsumoto | C08L 83/04 508/139 |
| 2017/0200667 A1* | 7/2017 | John | H01L 23/3677 |
| 2017/0283677 A1* | 10/2017 | Iwata | C09K 5/14 |
| 2017/0313924 A1* | 11/2017 | Iwata | C09K 5/10 |

FOREIGN PATENT DOCUMENTS

| | | | |
|---|---|---|---|
| JP | 8-208993 A | 8/1986 | |
| JP | 61-157569 A | 7/1988 | |
| JP | 2002-327116 A | 11/2002 | |
| JP | 2003-301189 A | 10/2003 | |
| JP | 3543863 B2 | 7/2004 | |
| JP | 2004-352947 A | 12/2004 | |
| JP | 3865638 B2 | 1/2007 | |
| JP | 4255287 B2 | 4/2009 | |
| JP | 2009-286855 A | 12/2009 | |
| JP | 2013-227374 A | 11/2013 | |

OTHER PUBLICATIONS

Extended European Search Report, dated Nov. 21, 2016, for European Application No. 16192979.9.

* cited by examiner

*Primary Examiner* — Marc S Zimmer
(74) *Attorney, Agent, or Firm* — Birch, Stewart, Kolasch & Birch, LLP

(57) ABSTRACT

Addition one-part curing-type heat-conductive silicone grease composition containing: (A) an organopolysiloxane containing at least one alkenyl group per molecule and having a viscosity of 50-100,000 mPa·s at 25° C.; (B) an organohydrogenpolysiloxane containing at least two silicon-bonded hydrogen atoms per molecule, having no $R_2SiO$ unit, having no silicon-bonded hydrogen atom at any terminal end, having the silicon-bonded hydrogen atoms only in a side chain or chains, and being in a substantially straight chain form, in an amount such that the ratio of {the number of Si—H groups}/{the number of alkenyl groups in the composition} is 0.1-5.0; (C) a photoactive-type platinum complex curing catalyst; and (D) a heat-conductive filler, wherein the composition has a viscosity at 25° C. of 30-800 Pa·s as measured by a Malcom viscometer at a rotational speed of 10 rpm. The composition has high shape-retention properties, is low in hardness, and can be stored at normal temperature.

5 Claims, No Drawings

ADDITION ONE PART CURING TYPE HEAT-CONDUCTIVE SILICONE GREASE COMPOSITION

CROSS-REFERENCE TO RELATED APPLICATION

This non-provisional application claims priority under 35 U.S.C. § 119(a) on Patent Application No. 2015-201832 filed to in Japan on Oct. 13, 2015, the entire contents of which are hereby incorporated by reference.

TECHNICAL FIELD

The present invention relates to an addition one part curing type heat-conductive silicone grease composition which is storable at normal temperature and which, particularly, is to be interposed between a heat-generating member (heating body), such as an electric or electronic part, and a heat-radiating member (cooling body) to transfer the heat generated from the heat-generating member to the heat-radiating member.

BACKGROUND ART

In connection with engine control and powertrain systems and body systems for controlling air conditioners and the like, in transportation vehicles, the contents of control have become more complicated and more systems have been becoming necessary for control. Attendant on this trend, the number of electronic control units (ECU) mounted on the vehicle is increasing every year, and the number of electronic elements mounted therein is also increasing. As a plurality of electronic elements and parts of different heights generate heat, heat-conductive materials are now indispensable to efficient transfer of the heat to die-cast aluminum casings.

Further, since it is recently required to mount more electronic elements and parts within a limited space, their mounting environment (e.g., ambient temperature, humidity, angle, thickness, etc.) is more diversified. In the case of engine ECU, for example, electronic elements and parts have come to be more often installed vertically in the engine room. Thus, there are more possibilities that heat-conductive materials are positioned vertically in a site where both vibration and high temperature are applied.

In connection with the use of heat-conductive materials in such environments, there have been several proposals made to prevent the heat-conductive material between the heating body and the cooling body from sagging and falling down, by the use of, for example, a heat-conductive silicone adhesive material, a heat-conductive potting material, or a room temperature-curable heat-conductive silicone rubber composition as the heat-conductive material (see JP-A 1996-208993, JP-A 1986-157569, JP-A 2004-352947, Japanese Patent No. 3543663, and Japanese Patent No. 4255287: Patent Documents 1 to 5).

However, since all these materials may have a high hardness and would adhere to substrates, they have drawbacks in that they are poor in re-workability and apply stresses to the heat-generating electronic elements. In addition, since the heat-conductive material cannot withstand the repeated stress due to thermal strain, it may peel from the heat-generating element or crack, leading to a rapid increase in thermal resistance.

In view of this, an addition one part heat-conductive material was discovered (JP-A 2003-301189: Patent Document 6) which has previously undergone a thermal cross-linking reaction to get a high viscosity (to maintain softness or flexibility) during preparation of the heat-conductive material so that the material is not liable to sag. Since this material is quite soft or flexible despite the high viscosity, its influence of exerting stress on the electronic elements is weak as compared with high-hardness materials. Since this material freely deforms and conforms in shape to a rugged surface (projected and recessed surface), it can be suitably applied to electronic elements of different heights. However, there is naturally a tradeoff problem that the coating with the material is difficult because of its high viscosity.

In recent years, a heat-conductive silicone composition lowered in viscosity as compared with the addition one part heat-conductive material has been developed (JP-A 2009-286855: Patent Document 7). Its viscosity is still high, and, accordingly, there has been a request for a heat-conductive silicone composition that has better workability and sag control.

The above-mentioned problem can be solved by an addition one part heat-conductive silicone composition (JP-A 2002-327116: Patent Document 8). This composition is readily dischargeable prior to heat curing, has a certain degree of re-workability even after heat curing, does not sag after curing, remains as a comparatively soft or flexible rubber even after curing, and thus can also play the role of a stress relaxing agent. Nevertheless, this addition one part heat-conductive silicone composition still has a problem to be solved. The problem is that when the addition one part heat-conductive silicone composition is further lowered in viscosity, the composition becomes flowable so that it may spread over the electronic element immediately after discharging, failing to establish a heat-dissipating passage if a substantial space is defined between the electronic element and the cooling substrate.

Under such circumstances, an addition one part heat-curable type heat-conductive silicone grease composition has been proposed which has high shape retention properties despite a low viscosity initially and is soft or flexible after curing. Since cold storage or refrigerating storage vessel is normally needed for storage of addition one part heat-conductive silicone compositions, however, there has been the problem of storage cost. In view of this, there has been a request for an addition one part heat-conductive silicone composition that can be stored at normal temperature, desirably at a temperature of up to 40° C. (JP-A 2013-227374: Patent Document 9).

As the above-mentioned other curing means, an organopolysiloxane gel composition has been proposed (Japanese Patent No. 3865638: Patent Document 10) which is photo-active by ultraviolet (UV) rays and in which a platinum complex curing catalyst is used. While the document describes the addition of an inorganic filler as an optional component, however, there is no description as to the amount of the inorganic filler added, and there is no description about thermal conductivity. Besides, this composition has a difficulty as to storage stability on a one part basis.

CITATION LIST

Patent Document 1: JP-A 1996-208993
Patent Document 2: JP-A 1986-157569
Patent Document 3: JP-A 2004-352947
Patent Document 4: Japanese Patent No. 3543663
Patent Document 5: Japanese Patent No. 4255287
Patent Document 6: JP-A 2003-301189
Patent Document 7: JP-A 2009-286855

Patent Document 8: JP-A 2002-327116
Patent Document 9: JP-A 2013-227374
Patent Document 10: Japanese Patent No. 3865638

SUMMARY OF THE INVENTION

Thus, there is a need for an addition one part curing type heat-conductive silicone grease composition which has high shape retention properties despite its low viscosity (its easy coating properties) initially, is soft or flexible (low in hardness) after curing, and can be stored at normal temperature.

In order to meet the need, the present inventors made extensive and intensive investigations. As a result of their investigations, the inventors found out that an addition one part curing type heat-conductive silicone grease composition which contains the following components (A) to (D), which preferably contains further the following component (E), which has an absolute viscosity at 25° C. before curing of 30 Pa·s to 800 Pa·s as measured by a Malcom viscometer at a rotational speed of 10 rpm, which, when 0.5 mL of the composition is applied onto an aluminum plate under a 25° C. environment so as to form a disk having a diameter of 1 cm and the disk is held horizontal for 24 hours, shows a diameter change within 1 mm, which has a hardness after curing of 1 to 90 as measured by an Asker C type rubber Durometer, and which can be stored at normal temperature, is advantageous as follows. Namely, the composition is advantageous in that the composition has high shape retention properties despite its low viscosity and its easy coating properties, is not liable to sag because of its flexibility even after curing, is expected to show stress-relaxing properties, is excellent in repairability, and shows good properties for storage at normal temperature on a one part basis. The present invention is based on the finding.

In one aspect of the present invention, there is provided an addition one part curing type heat-conductive silicone grease composition capable of being stored at normal temperature, the composition containing:

(A) 100 parts by weight of an organopolysiloxane containing at least one alkenyl group per molecule and having a viscosity of 50 mPa·s to 100,000 mPa·s at 25° C.;

(B) an organohydrogenpolysiloxane which contains at least two silicon-bonded hydrogen atoms per molecule, which has no $R_2SiO$ unit (where R independently represents an unsubstituted or substituted monovalent hydrocarbon group), which has no silicon-bonded hydrogen atom at any terminal end, which has the silicon-bonded hydrogen atoms only in a side chain or chains, and which is in a substantially straight chain form, in an amount such that the ratio of {the number of Si—H groups}/{the number of alkenyl groups in the composition} is in the range from 0.1 to 5.0;

(C) a photoactive type platinum complex curing catalyst selected from the group consisting of trimethyl(acetylacetonato)platinum complex, platinum trimethyl(2,4-pentanedionate) complex, platinum trimethyl(3,5-heptanedionate) complex, platinum trimethyl (methylacetoacetate) complex, bis(2,4-pentanedionato) platinum complex, bis(2,4-hexanedionato)platinum complex, bis(2,4-heptanedionato)platinum complex, bis(3,5-heptanedionato)platinum complex, bis(1-phenyl-1,3-butanedionato)platinum complex, bis(1,3-diphenyl-1,3-propanedionato)platinum complex, (1,5-cyclooctadienyl)dimethyl platinum complex, (1,5-cyclooctadienyl)diphenyl platinum complex, (1,5-cyclooctadienyl)dipropyl platinum complex, (2,5-norboradiene)dimethyl platinum complex, (2,5-norboradiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (dimethylphenylsilylcyclopentadienyl)triphenyl platinum complex, and (cyclopentadienyl)dimethyltrimethylsilylmethyl platinum complex, in an effective amount; and (D) 100 to 20,000 parts by weight of a heat-conductive filler having a thermal conductivity of at least 10 W/m·° C., wherein the composition has a viscosity at 25° C. of 30 Pa·s to 800 Pa·s as measured by a Malcom viscometer at a rotational speed of 10 rpm.

Preferably, the addition one part curing type heat-conductive silicone grease composition further contains (E) 5 to 900 parts by weight of an organopolysiloxane represented by the following general formula (1):

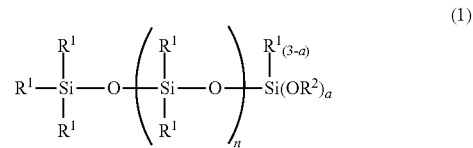

wherein $R^1$ groups are each independently an unsubstituted or substituted monovalent hydrocarbon group, $R^2$ groups are each independently an alkyl group, alkoxyalkyl group, alkenyl group, or acyl group, n is an integer of 2 to 100, and a is an integer of 1 to 3.

Preferably, the addition one part curing type heat-conductive silicone grease composition further contains (F) 0.1 to 100 parts by weight of a fine silica powder.

In the addition one part curing type heat-conductive silicone grease composition, preferably, the fine silica powder of the component (F) is surface-treated fumed silica.

Preferably, the addition one part curing type heat-conductive silicone grease composition has shape retention properties such that when 0.5 mL of the composition is applied onto an aluminum plate under an environment of 25° C. in such a manner as to form a disk having a diameter of 1 cm and the disk is kept horizontal at 25° C. for 24 hours, the disk shows a diameter change within 1 mm, and the composition, after heated and increased in viscosity, has a hardness of 1 to 90 as measure by an Asker C type rubber Durometer.

Advantageous Effects of the Invention

Since the addition one part curing type heat-conductive silicone grease composition capable of being stored at normal temperature according to the present invention has a low viscosity, it can be discharged and applied easily, and can freely deform to conform in shape to rugged shapes (projected and recessed shapes) of heat-generating electronic elements. In addition, since the composition is high in shape retention properties, once it is worked into a shape it can retain the shape. Since the composition after heated and increased in viscosity solidifies to a soft state without becoming hard, it is sag-controlled when positioned vertically, and it exerts no extra stress on the heat source. Further, the composition is excellent in repairability, and can be favorably stored at normal temperature on a one part basis.

DESCRIPTION OF THE PREFERRED EMBODIMENTS

The aspects of the present invention will be described in detail below.

The addition one part curing type heat-conductive silicone grease composition capable of being stored at normal temperature (25° C.) according to the present invention includes:

(A) an organopolysiloxane containing at least one alkenyl group per molecule and having a viscosity of 50 mPa·s to 100,000 mPa·s at 25° C.;

(B) an organohydrogenpolysiloxane which contains at least two silicon-bonded hydrogen atoms per molecule, which has no $R_2SiO$ unit (where R independently represents an unsubstituted or substituted monovalent hydrocarbon group), which has no silicon-bonded hydrogen atom at any terminal end, which has the silicon-bonded hydrogen atoms only in a side chain or chains, and which is in a substantially straight chain form;

(C) a specified photoactive type platinum complex curing catalyst; and (D) a heat-conductive filler having a thermal conductivity of at least 10 W/m·° C., further, preferably with (E) an organopolysiloxane represented by the following general formula (1):

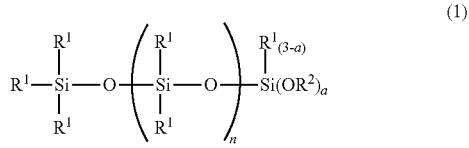

(1)

wherein $R^1$ groups are each independently an unsubstituted or substituted monovalent hydrocarbon group, $R^2$ groups are each independently an alkyl group, alkoxyalkyl group, alkenyl group, or acyl group, n is an integer of 2 to 100, and a is an integer of 1 to 3, and, further, optionally with (F) a fine silica powder.

The above-mentioned components will be described more in detail below.

The component (A) is a base polymer of the present composition, and is an organopolysiloxane containing at least one alkenyl group per molecule.

The organopolysiloxane of the component (A) has at least one silicon-bonded alkenyl group, preferably at least two silicon-bonded alkenyl groups, more preferably 2 to 3 silicon-bonded alkenyl groups, per molecule. Examples of the alkenyl group include alkenyl groups of 2 to 4 carbon atoms, such as vinyl, allyl, and butenyl.

Examples of silicon-bonded organic groups include, in addition to the alkenyl groups, unsubstituted or substituted monovalent hydrocarbon groups of 1 to 10 carbon atoms, preferably 1 to 6 carbon atoms, free of aliphatic unsaturated bonds, such as straight-chain alkyl groups, branched-chain alkyl groups, cycloalkyl groups, aryl groups, aralkyl groups, and haloalkyl groups. Examples of the straight-chain alkyl groups include methyl, ethyl, propyl, hexyl, octyl, and decyl. Examples of the branched-chain alkyl groups include isopropyl, isobutyl, tert-butyl, and 2-ethylhexyl. Examples of the cycloalkyl groups include cyclopentyl and cyclohexyl. Examples of the aryl groups include phenyl and tolyl. Examples of the aralkyl groups include 2-phenylethyl and 2-methyl-2-phenylethyl. Examples of the haloalkyl groups include 3,3,3-trifluoropropyl, 2-(nonafluorobutyl)ethyl, and 2-(heptadecafluorooctyl)ethyl.

Preferable examples of the silicon-bonded organic groups in the component (A) are straight-chain alkyl groups, alkenyl groups, and aryl groups, of which particularly preferred are methyl groups, vinyl groups, and phenyl groups.

The viscosity of the component (A) at 25° C. is in the range of 50 mPa·s to 100,000 mPa·s, preferably 200 mPa·s to 50,000 mPa·s, more preferably 300 mPa·s to 40,000 mPa·s, and further preferably 300 mPa·s to 30,000 mPa·s. Where the viscosity is in such a range, handleability or workability of the present composition can be easily secured, and good physical properties of a cured product of the present composition can be easily secured. Note that the viscosity is as measured by a rotational viscometer.

The molecular structure of the component (A) is not particularly limited. Examples of the molecular structure include a straight chain structure, a branched chain structure, a partially branched straight chain structure, and a dendritic structure (dendrimer form), of which preferred are the straight chain structure and the partially branched straight chain structure. The component (A) may be a homopolymer having such a molecular structure, a copolymer having such a molecular structure, or a mixture of at least two polymers having such a molecular structure.

Note that a terminal end of molecular chain is preferably a triorganosiloxy group or a diorganohydroxysiloxy group (wherein each of the organo groups is a monovalent hydrocarbon group of 1 to 10 carbon atoms such as the above-mentioned alkenyl groups, alkyl groups, and aryl groups).

Examples of the component (A) include both end dimethylvinylsiloxy-blocked dimethylpolysiloxane, both end methylphenylvinylsiloxy-blocked dimethylpolysiloxane, both end dimethylvinylsiloxy-blocked dimethylsiloxane/methylphenylsiloxane copolymers, both end dimethylvinylsiloxy-blocked dimethylsiloxane/methylvinylsiloxane copolymers, both end silanol-blocked dimethylsiloxane/methylvinylsiloxane copolymers, both end silanol-blocked dimethylsiloxane/methylvinyl-siloxane/methylphenylsiloxane copolymers, both end trimethylsiloxy-blocked dimethylsiloxane/methyl-vinylsiloxane copolymers, both end dimethylvinylsiloxy-blocked methyl(3,3,3-trifluoro-propyl)polysiloxane, and organosiloxane copolymers including siloxane units represented by the formula: $(CH_3)_3SiO_{1/2}$, siloxane units represented by the formula: $(CH_3)_2(CH_2=CH)SiO_{1/2}$, siloxane units represented by the formula: $CH_3SiO_{3/2}$, and siloxane units represented by the formula: $(CH_3)_2SiO_{2/2}$.

Note that the organopolysiloxane (A) basically includes a siloxane skeleton, and does not contain any alkoxy group.

The organohydrogenpolysiloxane which has at least two silicon-bonded hydrogen atoms per molecule, which has no $R_2SiO$ unit (where R independently represents an unsubstituted or substituted monovalent hydrocarbon group), which has no silicon-bonded hydrogen atom at any terminal end, which has silicon-bonded hydrogen atoms in only a side chain or chains, and which is in a substantially straight chain form of the component (B) is a curing agent for the present composition, and is capable of curing by mixing with the component (A) and the component (E).

The number of the silicon-bonded hydrogen atoms in this organohydrogenpolysiloxane is at least two, preferably 2 to 100, and more preferably 2 to 50.

Examples of silicon-bonded groups other than the silicon-bonded hydrogen atoms in the organohydrogenpolysiloxane include unsubstituted or substituted monovalent hydrocarbon groups of 1 to 10 carbon atoms, preferably 1 to 6 carbon atoms, free of aliphatic unsaturated bonds, specifically, straight chain alkyl groups, branched chain alkyl groups, cycloalkyl groups, aryl groups, aralkyl groups, and haloalkyl groups, and include those groups mentioned as examples of the component (A) described above and the component (E) described later. Preferable examples of the silicon-bonded groups other than the silicon-bonded hydrogen atoms are straight chain alkyl groups and aryl groups, particularly preferred examples being methyl groups and phenyl groups.

The viscosity of the organohydrogenpolysiloxane at 25° C. is not particularly limited, and is preferably in the range of 1 mPa·s to 200 mPa·s, particularly 1 mPa·s to 100 mPa·s. When the viscosity is in this range, handleability or workability of the present composition can be easily secured, and good physical properties of a cured product of the present composition can be easily secured. Note that the viscosity is as measured by a rotational viscometer.

The molecular structure of the organohydrogenpolysiloxane suitable for enhancing one part storage stability of the present composition is a molecular structure which has no $R_2SiO$ unit (where R independently represents an unsubstituted or substituted monovalent hydrocarbon group), which has no silicon-bonded hydrogen atom at any terminal end, which has silicon-bonded hydrogen atoms only in a side chain or chains, and which is in a substantially straight chain form. However, the straight chain form is not restrictive. For example, an organohydrogenpolysiloxane whose molecular structure is a branched chain form, a partially branched straight chain form, a cyclic form, or a dendritic form (dendrimer form) may be used in such a range as not to impair the good properties of the present composition. The organohydrogenpolysiloxane may be a homopolymer having such a molecular structure, a copolymer having such a molecular structure, or a mixture of such polymers.

As an example of the structure of the organohydrogenpolysiloxane of the component (B) suitable for enhancing one part storage stability of the present composition, there can be mentioned a structure represented by the following formula.

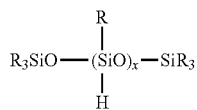

In the formula, as aforementioned, R independently represents an unsubstituted or substituted monovalent hydrocarbon group, of preferably 1 to 10 carbon atoms, more preferably 1 to 6 carbon atoms, examples of which include those groups mentioned as examples of the monovalent hydrocarbon groups described in the component (A) above, preferably those which have no aliphatic unsaturated bond.

Examples of the organohydrogenpolysiloxane of the component (B) as above include $Me_3SiO(MeHSiO)_8SiMe_3$, $Me_3SiO(MeHSiO)_{13}SiMe_3$, $Me_3SiO(MeHSiO)_{38}SiMe_3$ (wherein Me represents methyl), and mixtures of at least two of them.

Note that the organohydrogenpolysiloxane basically includes a siloxane skeleton, does not contain any alkoxy group, and is an indispensable component for enhancing one part storage stability of the present composition.

The amount of the organohydrogenpolysiloxane compounded as the component (B) is such an amount that the amount of the silicon-bonded hydrogen atoms (Si—H groups) in the component (B) is in the range of 0.1 mol to 5.0 mol, preferably 0.1 mol to 3.0 mol, more preferably 0.1 mol to 1.5 mol, per 1 mol of the silicon-bonded alkenyl groups in the component (A) and the component (E). When the content of the organohydrogenpolysiloxane is such an amount, the present composition cures sufficiently easily, and, at the same time, the composition is capable of curing to have an appropriate hardness, and is not liable to exert stress on heat-radiating elements.

The component (C) used in the present invention is a photoactive type platinum complex curing catalyst. While this curing catalyst originally is activated by irradiation with UV rays, the curing catalyst in the present composition is also capable of heat curing. Further, the curing catalyst has a catalytic action for accelerating an addition reaction of the component (B) with the component (A) and the component (E), while maintaining the one part storage stability of the present composition at normal temperature. In the present invention, a compound used as the photoactive type platinum complex curing catalyst of the component (C) means a β-diketone platinum complex or a platinum complex having a cyclic diene compound as a ligand.

Here, examples of the β-diketone platinum complex include trimethyl(acetylacetonato)platinum complex, platinum trimethyl(2,4-pentanedionate) complex, platinum trimethyl(3,5-heptadionate) complex, platinum trimethyl (methylacetoacetate) complex, bis(2,4-pentanedionato) platinum complex, bis(2,4-hexanedionato)platinum complex, bis(2,4-heptanedionato)platinum complex, bis(3, 5-heptanedionato)platinum complex, bis(1-phenyl-1,3-butanedionato)platinum complex, and bis(1,3-diphenyl-1,3-propanedionato)platinum complex.

In addition, examples of the platinum complex having a cyclic diene compound as a ligand include (1,5-cyclooctadienyl)dimethyl platinum complex, (1,5-cyclooctadienyl) diphenyl platinum complex, (1,5-cyclooctadienyl)dipropyl platinum complex, (2,5-norvoradiene)dimethyl platinum complex, (2,5-norboradiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (dimethylphenylsilylcyclopentadienyl)triphenyl platinum complex, and (cyclopentadienyl)dimethyltrimethylsilylmethyl platinum complex.

Particularly, for further enhancing one part storage stability of the present composition, a tetravalent complex having a cyclic diene compound as a ligand is preferred, examples of which include (methylcyclopentadienyl)trimethyl platinum complex.

The content of the component (C) may be an effective amount for the component (C) to function as a catalyst. For example, the component (C) is used in an amount of 1 ppm to 5,000 ppm, preferably 10 ppm to 500 ppm, as platinum metal, based on the total amount of the components (A), (B), and (E). If the amount of the component (C) compounded is less than 1 ppm, heat curing or the addition reaction by irradiation with UV rays would proceed conspicuously slowly or curing would not take place. If the amount of the component (C) exceeds 5,000 ppm, on the other hand, it may be impossible to secure the one part storage stability of the present composition, or thermal resistance of the resulting cured product may be lowered.

In the present invention, a controlling agent (G) may be used, as required, for the purpose of restraining the catalytic activity of the component (C) and further enhancing the one part storage stability of the present composition. The controlling agent is an agent which restrains the progress of a hydrosilylation reaction at a storage temperature of up to room temperature, and prolongs shelf life or pot life of the present composition. As the controlling agent, there can be used known reaction controlling agents, such as acetylene compounds, various nitrogen compounds, and organic phosphorus compounds. Specific examples of the compounds usable as the controlling agent include acetylene compounds such as 1-ethynyl-1-cyclohexanol and 3-butyn-1-ol, various nitrogen compounds such as triallyl isocyanurate and triallyl isocyanurate derivatives, and organic phosphorus compounds such as triphenylphosphine.

The amount of the component (G) compounded is preferably 0.01 to 1.5 parts by weight, more preferably 0.01 to 1.0 part by weight, per 100 parts by weight of the component (A). The reason is as follows. If the amount of the component (G) is less than 0.01 part by weight, it may be impossible to obtain the desired sufficient shelf life or pot life of the present composition. If the amount is more than 1.5 parts by weight, on the other hand, heat curing or curing by irradiation with UV rays, of the present composition, may not be achieved.

Note that the controlling agent of the component (G) may be used after dilution thereof with a solvent such as toluene, for enhancing dispersibility thereof into the silicone grease composition.

The heat-conductive filler having a thermal conductivity, to be used as the component (D), has a thermal conductivity of at least 10 W/m·° C., preferably at least 15 W/m·° C. If the thermal conductivity of the heat-conductive filler is less than 10 W/m·° C., the thermal conductivity of the present composition itself would be low. Note that there is no particularly upper limit to the thermal conductivity, but the thermal conductivity is preferably up to 2,000 W/m·° C.

Examples of the heat-conductive filler as above include aluminum powder, copper powder, silver powder, nickel powder, gold powder, alumina powder, zinc oxide powder, magnesium oxide powder, aluminum nitride powder, boron nitride powder, silicon nitride powder, diamond powder, and carbon powder, though any filler having a thermal conductivity of at least 10 W/m·° C. may be used. These fillers may be used either singly or as a mixture of at least two of them.

The heat-conductive filler has an average particle diameter of preferably 0.1 μm to 300 μm, more preferably 0.1 μm to 200 μm. If the average particle diameter is smaller than 0.1 μm, the present composition may not become greasy and may be poor in extensibility. If the average particle diameter is greater than 300 μm, the present composition may be poor in uniformity. The filler may be irregular or spherical in shape or may be in any other shape. The average particle diameter may be determined, for example, as a weight average value (or median diameter) by a laser light diffraction method.

The amount of the heat-conductive filler of the component (D) is in the range of 100 to 20,000 parts by weight, preferably 500 to 15,000 parts by weight per 100 parts by weight of the component (A). If the amount of the heat-conductive filler is less than 100 parts by weight, a desired thermal conductivity cannot be obtained. If the amount of the heat-conductive filler exceeds than 20,000 parts by weight, the present composition would not become greasy and would be poor in extensibility.

The component (E) is an organopolysiloxane represented by the following general formula (1), and preferably having a viscosity of 5 mPa·s to 100,000 mPa·s at 25° C.

The component (E) plays an important role of keeping the present composition at low hardness after thermal increase of viscosity, and causing an initial viscosity of the composition to be low.

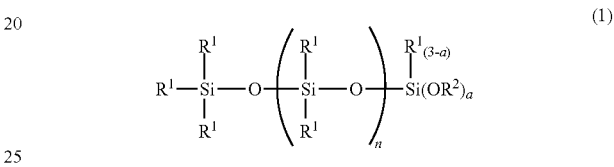

In the formula, $R^1$ groups are each independently an unsubstituted or substituted monovalent hydrocarbon group, $R^2$ groups are each independently an alkyl group, alkoxyalkyl group, alkenyl group, or acyl group, n is an integer of 2 to 100, and a is an integer of 1 to 3.

In the above formula (1), $R^1$ groups are each independently an unsubstituted or substituted monovalent hydrocarbon group of preferably 1 to 10 carbon atoms, more preferably 1 to 6 carbon atoms, and further preferably 1 to 3 carbon atoms. Examples of such monovalent hydrocarbon groups include straight chain alkyl groups, branched chain alkyl groups, cycloalkyl groups, alkenyl groups, aryl groups, aralkyl groups, and haloalkyl groups. Examples of the straight chain alkyl groups include methyl, ethyl, propyl, hexyl, octyl, and decyl. Examples of the branched chain alkyl groups include isopropyl, isobutyl, tert-butyl, and 2-ethylhexyl. Examples of the cycloalkyl groups include cyclopentyl, and cyclohexyl. Examples of the alkenyl groups include vinyl and allyl. Examples of the aryl groups include phenyl and tolyl. Examples of the aralkyl groups include 2-phenylethyl and 2-methyl-2-phenylethyl. Examples of the haloalkyl groups include 3,3,3-trifluoropropyl, 2-(nonafluorobutyl)ethyl, and 2-(heptadecafluorooctyl)ethyl. As $R^1$, preferred are methyl groups and phenyl groups.

In the above formula (1), $R^2$ groups are each independently alkyl, alkoxyalkyl, alkenyl, or acyl group. Examples of the alkyl groups include the same groups as those straight chain alkyl groups, branched chain alkyl groups, and cycloalkyl groups mentioned above as examples of $R^1$. Examples of the alkoxyalkyl groups include methoxyethyl and methoxypropyl. Examples of the alkenyl groups include the same groups as those mentioned above as examples of $R^1$. Examples of the acyl groups include acetyl and octanoyl. As $R^2$, preferred are alkyl groups, and particularly preferred are methyl groups and ethyl groups.

In the above formula (1), n is an integer of 2 to 100, preferably 10 to 50, and a is an integer of 1 to 3, preferably 3.

The viscosity of the component (E) at 25° C. is normally 5 mPa·s to 100,000 mPa·s, and, particularly, it is preferably 5 mPa·s to 5,000 mPa·s. If the viscosity is below 5 mPa·s, oil bleeding from the silicone grease composition obtained would occur easily, and sagging may be liable to occur. If the viscosity is above 100,000 mPa·s, the silicone grease composition obtained would be extremely poor in flowability, so that workability in coating may be worsened. Note that the viscosity is as measured by a rotational viscosity.

Preferable examples of the component (E) include the followings.

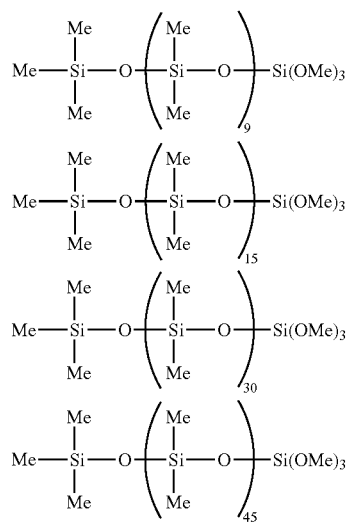

In the formulas, Me is methyl.

The component (E) may not necessarily be compounded, but is preferably compounded. Where the component (E) is compounded, the amount of the component (E) is preferably in the range of 10 to 900 parts by weight, more preferably 20 to 700 parts by weight per 100 parts by weight of the component (A). If the amount of the component (E) is less than 5 parts by weight, the present composition would become hard after heated, so that it may be impossible to obtain a soft or flexible composition. If the amount is more than 900 parts by weight, curing of the composition may be difficult to achieve.

Note that in the present invention, an organopolysiloxane having no silicon-bonded alkenyl group may be used together, in addition to the components (A) and (E). Examples of the organopolysiloxane free of silicon-bonded alkenyl groups include both end silanol-blocked dimethylpolysiloxane, both end silanol-blocked dimethylsiloxane/methylphenylsiloxane copolymers, both end trimethoxysiloxy-blocked dimethylpolysiloxane, both end trimethoxysiloxy-blocked dimethylsiloxane/methylphenylsiloxane copolymers, both end methyldimethoxysiloxy-blocked dimethylpolysiloxane, both end triethoxysiloxy-blocked dimethylpolysiloxane, both end trimethoxysilylethyl-blocked dimethylpolysiloxane, and mixtures of at least two of them.

The fine silica powder of the component (F) is a component for imparting shape retention properties to the composition. As the fine silica powder, surface-treated fumed silica is preferably used. The surface treatment enhances dispersibility of the silica powder in the components (A), (B), and (E), enabling uniform dispersion. Besides, a mutual action of fine particles of the surface-treated fumed silica and interactions between the surface-treated fumed silica and the components (A), (B), and (E) can impart shape retention properties to the composition.

Effective examples of the surface treating agent include chlorosilane, silazane, and siloxanes. Specific examples of the surface treating agent include methyltrichlorosilane, dimethyldichlorosilane, trimethylchlorosilane, hexamethyldisilazane, octamethylcyclotetrasiloxane, and α,ω-trimethylsilyldimethylpolysiloxane.

In addition, the component (F) preferably has a specific surface area (BET method) of at least 50 m$^2$/g, more preferably at least 100 m$^2$/g. If the specific surface area is less than 50 m$^2$/g, the shape retention properties of the present composition may be worsened. Note that the specific surface area (BET method) is preferably up to 500 m$^2$/g, more preferably up to 300 m$^2$/g, from the viewpoint that enhanced shape retention properties can be thereby obtained.

The amount of the component (F) added is in the range of 0 to 100 parts by weight per 100 parts by weight of the component (A), since the present composition does not become greasy and is poor in extensibility if this amount is more than 100 parts by weight. Where added, the amount of the component (F) is 0.1 to 100 parts by weight, preferably 1 to 80 parts by weight, and more preferably 1 to 50 parts by weight, per 100 parts by weight of the component (A).

Other than the above-mentioned components, additives known for use as additives in addition one part curing type heat-conductive silicone grease compositions may be added to the present composition, in such ranges as not to impair the object of the present invention. Examples of applicable additives include hindered phenol antioxidants, reinforcing and non-reinforcing fillers such as calcium carbonate, and thixotropic agents such as polyethers. Further, colorants such as pigments and dyes may be added, as required.

Besides the components (A) to (F), an adhesion promoter (H) such as silane coupling agents as shown below may be added, in order to make the present composition adhesive to various adherends, in such a range as not to impair the effects of the present invention. Note that the amount of the adhesion promoter, if compounded, is preferably 0.1 to 20 parts by weight per 100 parts by weight of the component (A).

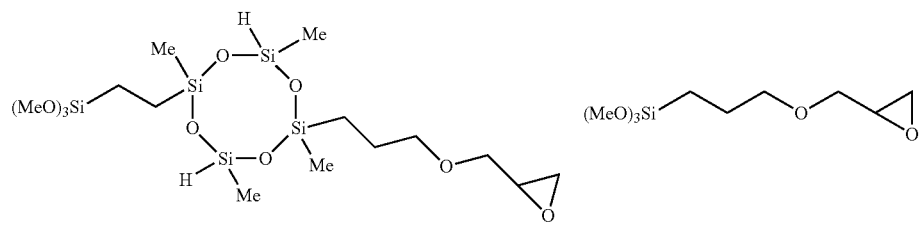

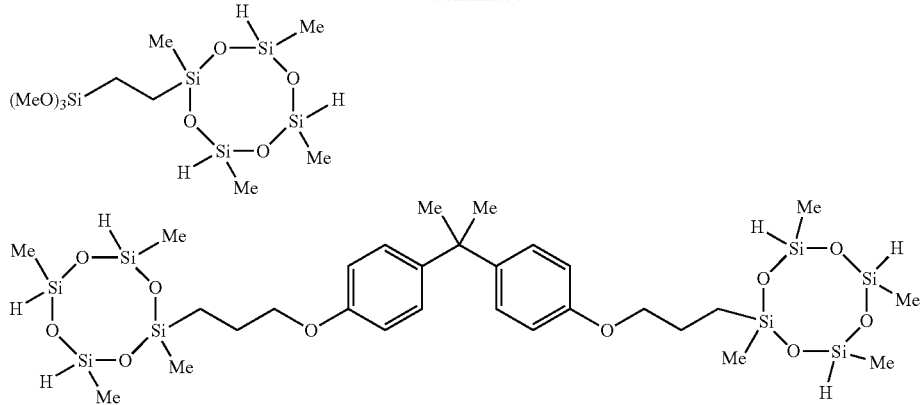

In the formulas, Me is methyl.

The addition one part curing type heat-conductive silicone grease composition of the present invention can be prepared by uniformly mixing the above-mentioned components by a known method.

The addition one part curing type heat-conductive silicone grease composition thus obtained preferably has an absolute viscosity at 25° C. of 30 Pa·s to 800 Pa·s, more preferably 30 Pa·s to 600 Pa·s as measured by a Malcom viscometer at a rotational speed of 10 rpm. If the viscosity is below 30 Pa·s, the dischargeability of the composition may be too high and may not be adjustable. If the viscosity exceeds 800 Pa·s, the composition may not be said to have good dischargeability. Note that the initial viscosity of the addition one part curing type heat-conductive silicone grease composition can be set to within the range by adjusting the balance of the component (A) and (B).

When 0.5 mL of the addition one part curing type heat-conductive silicone grease composition thus obtained is applied onto an aluminum plate so as to form a disk having a diameter of 1 cm and the disk is kept horizontal for 24 hours in a 25° C. environment, it is preferable that the composition shows a diameter change within 1 mm, particularly within 0.5 mm. A diameter change in excess of 1 mm may indicate a shortage of shape retention properties. Note that in order that the addition one part curing type heat-conductive silicone grease composition shows a diameter change within 1 mm under the above-mentioned conditions, it is recommendable to set the amount of the component (F) added to within the range of 0.1 to 100 parts by weight per 100 parts by weight of the component (A).

Since the addition one part curing type heat-conductive silicone grease composition of the present invention has a low viscosity initially, the composition can deform freely according to a rugged contour (projections and recesses). In addition, since the composition is high in shape retention properties, it can retain its shape after deformation. The low viscosity and the high shape retention properties ensure that even when a heat-generating part is complicated in shape, the composition can come into close contact with every corner of the heat-generating part and can retain its shape.

Besides, unlike conventional heat-conductive silicone adhesive materials and heat-conductive silicone potting materials, the addition one part curing type heat-conductive silicone grease composition of the present invention can be stored at normal temperature on a one part basis, and is characterized by curing to a soft or flexible state by heating.

A heating condition for thickening of (increasing the viscosity of) the addition one part curing type heat-conductive silicone grease composition of the present invention is a heating temperature of, for example, preferably at least 80° C. More preferably, the heating temperature is at least 100° C., for shortening the curing time. An upper limit to the heating temperature is preferably up to 200° C., more preferably up to 180° C.

Note that the addition one part curing type heat-conductive silicone grease composition of the present invention, after curing by heating, has a hardness at 25° C. of preferably 1 to 90, more preferably 10 to 80 as measured by an Asker C type rubber Durometer. If the hardness is below the range, the composition may be too soft and sag. If the hardness is above the range, the composition may be too hard and apply a stress to the heat source. Note that the hardness of a cured product of the addition one part curing type heat-conductive silicone grease composition of the present invention can be set to within the above-mentioned range by adjusting the ratio of the number of Si—H groups in the component (B) to the total number of alkenyl groups in the components (A) and (E).

Since the addition one part curing type heat-conductive silicone grease composition thus obtained remains soft or flexible even after curing, it is anti-sagging and superior in repairability, and is free of fear of applying high stresses to electronic elements.

EXAMPLES

The present invention will be described more in detail below by showing Examples and Comparative Examples, but the present invention is not to be limited to the following Examples. Examples are shown for the purpose of more clearly demonstrating the superiority of the present invention. Note that Me in the formulas below stands for methyl.

First, the following components were provided.

Component (A)
 A-1: Both end dimethylvinylsilyl-blocked dimethylpolysiloxane having a viscosity of 600 mPa·s at 25° C.
 A-2: Both end dimethylvinylsilyl-blocked dimethylpolysiloxane having a viscosity of 30,000 mPa·s at 25° C.

Component (B)
 B-1: $Me_3SiO(MeHSiO)_8SiMe_3$
 B-2: $Me_3SiO(MeHSiO)_{38}SiMe_3$
 B-3: $Me_3SiO(Me_2SiO)_{18}(MeHSiO)_{28}SiMe_3$ (for comparison)

B-4: $Me_3SiO(Me_2SiO)_{24}(MeHSiO)_4SiMe_3$ (for comparison)

Component (C)
- C-1: [2-(2-Butoxyethoxy)ethyl acetate] solution containing 1% by weight of bis(2,4-pentanedionato)platinum complex
- C-2: Both end dimethylvinylsilyl-blocked dimethylpolysiloxane solution containing 1% by weight of (methylcyclopentadienyl)trimethyl platinum complex and having a viscosity of 600 mPa·s at 25° C.
- C-3: Chloroplatinic acid-1,3-divinyltetramethyldisiloxane complex adjusted to have the same platinum concentration as that of C-1 (for comparison)

Component (D)
- D-1: Alumina powder having an average particle diameter of 10 μm (thermal conductivity: 27 W/m·° C.)
- D-2: Aluminum powder having an average particle diameter of 12 μm (thermal conductivity: 236 W/m·° C.)

Component (E)
- E-1: Organopolysiloxane represented by the following formula:

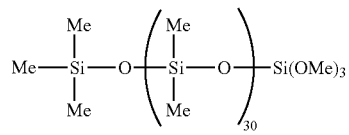

Component (F)
- F-1: Fumed silica surface treated with dimethyldichlorosilane to be hydrophobic and having a BET specific surface area of 120 m²/g Component (H)
- H-1: Adhesion promoter represented by the following formula:

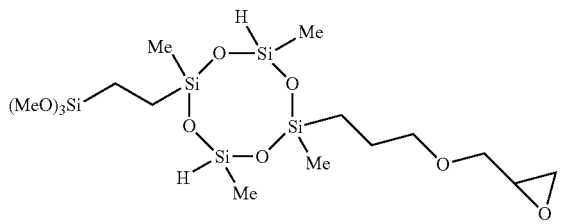

Examples 1 to 7 and Comparative Examples 1 to 3

The above-mentioned components (A) to (H) were mixed in amounts set forth in Table 1, to obtain compositions of Examples 1 to 7 and Comparative Examples 1 to 3. Specifically, the component (A), (D), and (E) in the amounts shown in Table 1 were placed in a 5-liter (L) gate mixer (trade name: 5-L Planetary Mixer, manufactured by Inoue Mfg., Inc.), and the contents were deaerated, heated and mixed at 150° C. for two hours. Thereafter, the contents were cooled to normal temperature, the components (B) and (F) were added thereto, and the resulting contents were mixed at room temperature to be uniform. Further, the component (C) was added, and the resulting contents were deaerated and mixed at room temperature until uniform. Optionally, the component (H) was added, and the resulting contents were stirred at room temperature to be uniform. The compositions thus obtained were evaluated for viscosity, hardness after curing, thermal conductivity, shape retention properties, and storage stability by the following methods. The results are also set forth in Table 1. In Comparative Example 3, the compositions increased the viscosity and turned into a gel immediately after addition of the component (C), therefore each properties of the compositions could not be evaluated.

[Evaluation of Initial Viscosity]

The initial viscosity of the addition one part curing type heat-conductive silicone grease composition is a value at 25° C. as measured by a Malcom viscometer (type PC-10AA).

[Evaluation of Hardness after Curing]

The addition one part curing type heat-conductive silicone grease composition was made to flow into a mold for molding into a cured thickness of 6 mm, and was cured at 150° C. for one hour. Two 6 mm-thick cured products thus obtained were laid on each other, and hardness was measured by an Asker C type rubber Durometer.

[Evaluation of Thermal Conductivity]

The thermal conductivity of the addition one part curing type heat-conductive silicone grease composition before curing was measured at 25° C. using a hot disk method thermal property meter TPA-501 manufactured by Kyoto Electronics Manufacturing Co., Ltd.

[Evaluation of Shape Retention Properties]

0.5 mL of the addition one part curing type heat-conductive silicone grease composition was applied onto an aluminum plate under a 25° C. environment, to form a disk (diameter: approximately 1 cm). The disk was held for one day (24 hours) immediately after the completion of application, and measured for diameter. A change of diameter (mm) was measured and used as an index of shape retention properties. The less the moving distance, the higher are the shape retention properties.

[Evaluation of Storage Stability]

The drying time of the addition one part curing type heat-conductive silicone grease composition under a 25° C. environment was confirmed by finger touch. The longer the drying time, the better the storage stability on a one part basis. The viscosity after the lapse of the storage days was measured by use of the above-mentioned Malcom viscometer (type PC-10AA). Concurrently, the viscosity after acceleration at 40° C. for 90 days was also measured.

TABLE 1

| Amount compounded (parts by weight) | | Example | | | | | | | Comparative Example | | |
|---|---|---|---|---|---|---|---|---|---|---|---|
| | | 1 | 2 | 3 | 4 | 5 | 6 | 7 | 1 | 2 | 3 |
| Component (A) | A-1 | 75 | 75 | 75 | 75 | 75 | 75 | 75 | 75 | 75 | 75 |
| | A-2 | 10 | 10 | 10 | 10 | 10 | 10 | 10 | 10 | 10 | 10 |
| Component (B) | B-1 | 0.25 | 0.25 | 0.25 | 0.25 | 0 | 0 | 0 | 0 | 0 | 0.25 |
| | B-2 | 0 | 0 | 0 | 0 | 0.22 | 0.22 | 0.22 | 0 | 0 | 0 |
| | B-3 | 0 | 0 | 0 | 0 | 0 | 0 | 0 | 0.6 | 0 | 0 |
| | B-4 | 0 | 0 | 0 | 0 | 0 | 0 | 0 | 0 | 2.2 | 0 |

TABLE 1-continued

| Amount compounded (parts by weight) | | Example | | | | | | | Comparative Example | | |
|---|---|---|---|---|---|---|---|---|---|---|---|
| | | 1 | 2 | 3 | 4 | 5 | 6 | 7 | 1 | 2 | 3 |
| Component (C) | C-1 | 1.2 | 1.2 | 0 | 0 | 1.2 | 1.2 | 1.2 | 1.2 | 1.2 | 0 |
| | C-2 | 0 | 0 | 0.3 | 0.3 | 0 | 0 | 0 | 0 | 0 | 0 |
| | C-3 | 0 | 0 | 0 | 0 | 0 | 0 | 0 | 0 | 0 | 0.6 |
| Component (D) | D-1 | 1,000 | 1,000 | 1,000 | 1,000 | 1,000 | 0 | 0 | 1,000 | 1,000 | 1,000 |
| | D-2 | 0 | 0 | 0 | 0 | 0 | 600 | 600 | 0 | 0 | 0 |
| Component (E) | E-1 | 15 | 15 | 15 | 15 | 15 | 15 | 15 | 15 | 15 | 15 |
| Component (F) | F-1 | 2.5 | 0 | 2.5 | 0 | 0 | 2.5 | 0 | 2.5 | 2.5 | 0 |
| Component (H) | H-1 | 0.1 | 0.1 | 0.1 | 0.1 | 0.1 | 0 | 0 | 0 | 0 | 0 |
| Si—H/Si-Vi (mol/mol) | | 0.4 | 0.4 | 0.4 | 0.4 | 0.4 | 0.4 | 0.4 | 0.4 | 0.4 | 0.4 |
| Viscosity (Pa·s) | | 94 | 81 | 105 | 92 | 92 | 126 | 111 | 88 | 71 | — |
| Thermal conductivity (W/m·°C.) | | 3.0 | 3.0 | 3.1 | 3.1 | 3.0 | 3.0 | 3.0 | 3.0 | 2.8 | — |
| Hardness (Asker C) | | 31 | 30 | 32 | 31 | 26 | 20 | 19 | 51 | 40 | — |
| Shape retention properties (mm) | | 0 | 0.1 | 0 | 0.1 | 0.1 | 0 | 0.1 | 0 | 0 | — |
| 25° C. Storage stability (days) | | at least 180 | at least 180 | at least 180 | at least 180 | at least 180 | at least 180 | at least 180 | less than 2 | less than 5 | — |
| Viscosity after storage at 25° C. (Pa·s) | | 117 | 105 | 116 | 99 | 103 | 151 | 139 | — | — | — |
| Viscosity after acceleration at 40° C. (Pa·s) | | 193 | 180 | 142 | 123 | 187 | 229 | 202 | — | — | — |

Japanese Patent Application No. 2015-201832 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An addition one part curing type heat-conductive silicone grease composition capable of being stored at normal temperature, the composition comprising,
   (A) 100 parts by weight of an organopolysiloxane containing at least one alkenyl group per molecule and having a viscosity of 50 mPa·s to 100,000 mPa·s at 25° C.;
   (B) an organohydrogenpolysiloxane which contains at least two silicon-bonded hydrogen atoms per molecule, which has no $R_2SiO$ unit (where R independently represents an unsubstituted or substituted monovalent hydrocarbon group), which has no silicon-bonded hydrogen atom at any terminal end, which has the silicon-bonded hydrogen atoms only in a side chain or chains, and which is in a substantially straight chain form, in an amount such that the ratio of {the number of Si—H groups}/{the number of alkenyl groups in the composition} is in the range from 0.1 to 5.0;
   (C) a photoactive type platinum complex curing catalyst selected from the group consisting of
trimethyl(acetylacetonato)platinum complex,
platinum trimethyl(2,4-pentanedionate) complex,
platinum trimethyl(3,5-heptanedionate) complex,
platinum trimethyl(methylacetoacetate) complex,
bis(2,4-pentanedionato)platinum complex,
bis(2,4-hexanedionato)platinum complex,
bis(2,4-heptanedionato)platinum complex,
bis(3,5-heptanedionato)platinum complex,
bis(1-phenyl-1,3-butanedionato)platinum complex,
bis(1,3-diphenyl-1,3-propanedionato)platinum complex,
(1,5-cyclooctadienyl)dimethyl platinum complex,
(1,5-cyclooctadienyl)diphenyl platinum complex,
(1,5-cyclooctadienyl)dipropyl platinum complex,
(2,5-norboradiene)dimethyl platinum complex,
(2,5-norboradiene)diphenyl platinum complex,
(cyclopentadienyl)dimethyl platinum complex,
(methylcyclopentadienyl)diethyl platinum complex,
(trimethylsilylcyclopentadienyl)diphenyl platinum complex,
(methylcycloocta-1,5-dienyl)diethyl platinum complex,
(cyclopentadienyl)trimethyl platinum complex,
(cyclopentadienyl)ethyldimethyl platinum complex,
(cyclopentadienyl)acetyldimethyl platinum complex,
(methylcyclopentadienyl)trimethyl platinum complex,
(methylcyclopentadienyl)trihexyl platinum complex,
(trimethylsilylcyclopentadienyl)trimethyl platinum complex,
(dimethylphenylsilylcyclopentadienyl)triphenyl platinum complex, and
(cyclopentadienyl)dimethyltrimethylsilylmethyl platinum complex, in an effective amount; and
   (D) 100 to 20,000 parts by weight of a heat-conductive filler having a thermal conductivity of at least 10 W/m·° C.,
   wherein the composition has a viscosity at 25° C. of 30 Pa·s to 800 Pa·s as measured by a Malcom viscometer at a rotational speed of 10 rpm.

2. The addition one part curing type heat-conductive silicone grease composition according to claim 1, further comprising
   (E) 5 to 900 parts by weight of an organopolysiloxane represented by the following general formula (1):

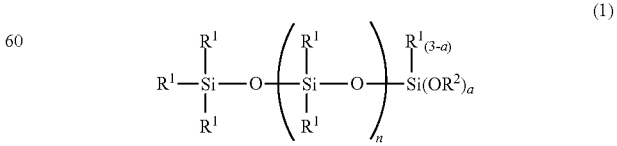

wherein $R^1$ groups are each independently an unsubstituted or substituted monovalent hydrocarbon group, $R^2$ groups are each independently an alkyl group, alkoxyalkyl group, alkenyl group, or acyl group, n is an integer of 2 to 100, and a is an integer of 1 to 3.

3. The addition one part curing type heat-conductive silicone grease composition according to claim 1, further comprising (F) 0.1 to 100 parts by weight of a fine silica powder.

4. The addition one part curing type heat-conductive silicone grease composition according to claim 3, wherein the fine silica powder of the component (F) is surface-treated fumed silica.

5. The addition one part curing type heat-conductive silicone grease composition according to claim 1, wherein the composition has shape retention properties such that when 0.5 mL of the composition is applied onto an aluminum plate under an environment of 25° C. in such a manner as to form a disk having a diameter of 1 cm and the disk is kept horizontal at 25° C. for 24 hours, the disk shows a diameter change within 1 mm, and the composition, after being heated and increased in viscosity, has a hardness of 1 to 90 as measure by an Asker C type rubber Durometer.

* * * * *